(12) United States Patent
Odmark

(10) Patent No.: US 6,472,970 B1
(45) Date of Patent: Oct. 29, 2002

(54) APPARATUS FOR ATTACHING AN ELECTRIC COIL TO A PRINTED CIRCUIT BOARD

(75) Inventor: Kurt R. Odmark, Farmington Hills, MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/878,019

(22) Filed: Jun. 8, 2001

(51) Int. Cl.⁷ ............................................. H01F 27/30
(52) U.S. Cl. ...................... 336/208; 336/192; 336/198
(58) Field of Search ..................... 336/192, 65, 198, 336/208; 439/83; 29/840

(56) References Cited

U.S. PATENT DOCUMENTS

| | | |
|---|---|---|
| 3,400,358 A | 9/1968 | Byrnes et al. |
| 4,484,170 A * | 11/1984 | Wirth et al. ................... 336/65 |
| 4,495,480 A * | 1/1985 | Martin et al. ............... 335/199 |
| 4,586,778 A | 5/1986 | Walter et al. |
| 4,767,343 A | 8/1988 | Ehrgott |
| 5,106,310 A | 4/1992 | Krajewski et al. |
| 5,129,830 A | 7/1992 | Krajewski et al. |
| 5,715,595 A | 2/1998 | Kman et al. |
| 5,761,050 A | 6/1998 | Archer |
| 6,141,948 A * | 11/2000 | Brazeau ..................... 57/58.65 |
| 6,373,367 B1 * | 4/2002 | Lu ............................... 336/198 |

* cited by examiner

*Primary Examiner*—Anh Mai
(74) *Attorney, Agent, or Firm*—Tarolli, Sundheim, Covell, Tummino & Szabo L.L.P.

(57) ABSTRACT

An apparatus (10) for attaching an electric coil (12) to a printed circuit board includes a spool (14) having a shaft (20) with axially opposite first and second ends (22 and 24). The electric coil (12) is supported on the shaft (20) between the first and second ends (22 and 24). The apparatus (10) further includes at least one compliant pin (16 and 18) having a stem portion (46) and a compliant portion (48). Part of the stem portion (46) extends into the first end (22) of the shaft (20) of the spool (14) and at least partially along the shaft (20) of the spool (14). The compliant portion (48) is located on an end of the compliant pin (16 and 18) and extends outwardly from the first end (22) of the shaft (20) of the spool (14) for attaching to the printed circuit board.

6 Claims, 1 Drawing Sheet

APPARATUS FOR ATTACHING AN ELECTRIC COIL TO A PRINTED CIRCUIT BOARD

TECHNICAL FIELD

The present invention relates to an apparatus for attaching an electric coil to a printed circuit board.

BACKGROUND OF THE INVENTION

A known apparatus for attaching an electric coil to a printed circuit board includes a spool for supporting the electric coil and an elongated pin. A portion of the pin is embedded in the spool and the remainder of the elongated pin extends outwardly from the spool. An end of a wire forming the electric coil is terminated on the portion of the pin extending outwardly from the spool. To secure the wire to the pin, the pin is dip soldered after the wire is terminated on the pin. The pin is then inserted through a connection hole in a printed circuit board and is soldered to the printed circuit board. The pin is soldered to the printed circuit board on a side of the printed circuit board opposite the spool.

Attaching the known apparatus to the printed circuit board is very labor intensive and requires handling of the printed circuit board to access the side of the printed circuit board opposite the spool. Many printed circuit boards are damaged during the process of attaching the known apparatus. These damaged printed circuit boards must be scrapped.

An apparatus for attaching an electric coil to a printed circuit board that can reduce the likelihood of damaging the printed circuit board is desirable. It is further desirable for the apparatus to be easily and efficiently manufactured in large quantities.

SUMMARY OF THE INVENTION

The present invention is an apparatus for attaching an electric coil to a printed circuit board. The apparatus comprises a spool having a shaft with axially opposite first and second ends. The electric coil is supported on the shaft between the first and second ends. The apparatus further comprises at least one compliant pin having a stem portion and a compliant portion. Part of the stem portion extends into the first end of the shaft of the spool and at least partially along the shaft of the spool. The compliant portion is located on an end of the compliant pin and extends outwardly from the first end of the shaft of the spool for attaching to the printed circuit board.

BRIEF DESCRIPTION OF THE DRAWINGS

The foregoing and other features of the present invention will become apparent to those skilled in the art to which the present invention relates upon reading the following description with reference to the accompanying drawings, in which.

DETAILED DESCRIPTION OF THE INVENTION

Figure 1:
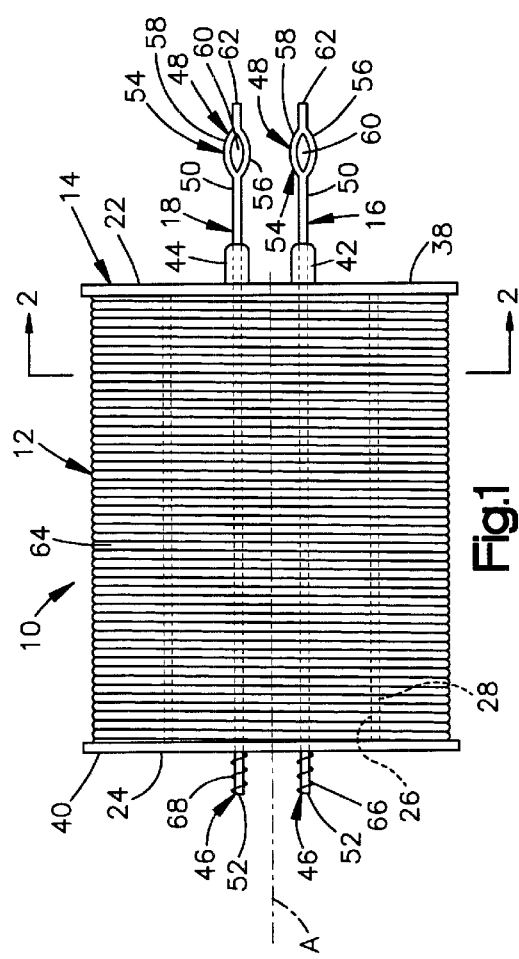
FIG. 1 is a view of an apparatus constructed in accordance with the present invention.

FIG. 1 illustrates an apparatus 10, constructed in accordance with the present invention, for attaching an electric coil 12 to a printed circuit board (not shown). The apparatus 10 includes a spool 14 and first and second compliant pins 16 and 18, respectively.

Figure 2:
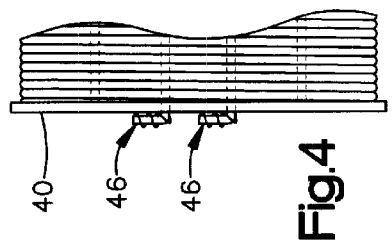
FIG. 2 is a view taken along line 2—2 in FIG. 1.
Figure 3:
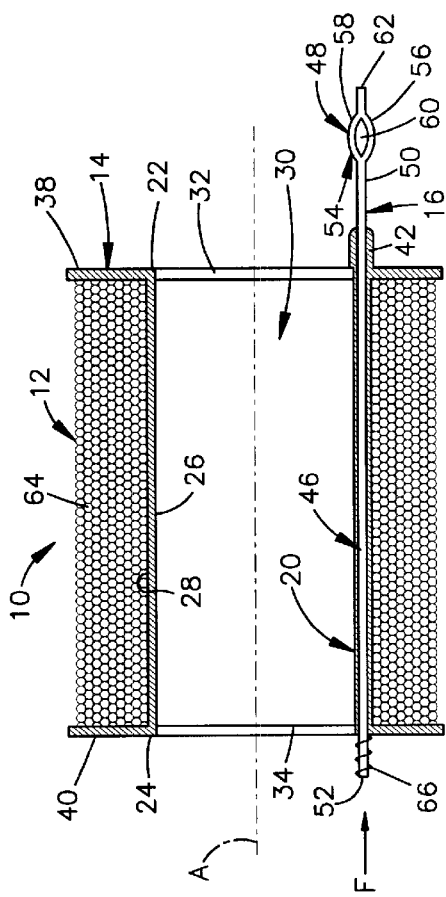
FIG. 3 is a view taken along line 3—3 in FIG. 2.

As shown in FIG. 3, the spool 14 includes a tubular shaft 20. The tubular shaft 20 extends along axis A and includes a first end 22 and a second end 24. A length of the shaft 20 is defined as the axial distance between the first and second ends 22 and 24. The shaft 20 has an inner surface 26 (FIG. 2) and an outer surface 28 (FIG. 2). The inner surface 26 is cylindrical and is centered on axis A. The inner surface 26 defines a passage 30 that extends axially through the tubular shaft 20. The first end 22 of the shaft 20 defines a first circular opening 32 (FIG. 3) to the passage 30 and the second end 24 of the shaft 20 defines a second circular opening 34 (FIG. 3) to the passage 30. The outer surface 28 of the shaft 20 is adapted for receiving an electric coil 12.

The shaft 20 has a thickness that is defined as the distance between the inner surface 26 and the outer surface 28. A portion 36 (FIG. 2) of the shaft 20, comprising approximately ninety degrees of the circumference of the shaft 20, has a thickness of approximately twice the thickness of the remaining 270 degrees of the circumference of the shaft 20. The thicker portion 36 of the shaft 20 extends axially along the shaft 20 from the first end 22 to the second end 24. The thicker portion 36 of the shaft 20 is adapted for receiving the first and second compliant pins 16 and 18.

As shown in FIG. 3, the spool 14 further includes first and second flanges 38 and 40, respectively. The first flange 38 extends radially outwardly from the first end 22 of the shaft 20 a distance of approximately one-half the inner diameter of the shaft 20. The second flange 40 extends radially outwardly from the second end 24 of the shaft 20 a distance equal to that of the first flange 38. Preferably, the spool 20 is made of plastic and is injection molded as one piece.

As shown in FIG. 1, the spool may further include first and second support portions 42 and 44, respectively. The first and second support portions 42 and 44 extend axially outwardly of the first end 22 of the shaft 20 for supporting the first and second compliant pins 16 and 18. The first and second support portions 42 and 44 are molded as part of the shaft 20 and have an outer diameter of approximately three times the width of a compliant pin 16 or 18.

The first compliant pin 16 is preferably made from phosphorous bonze or brass to provide enough spring force for the compliant section and includes an elongated stem portion 46 and a compliant portion 48. Preferably, the stem portion 46 has a square cross-sectional shape with each surface forming the square having a width of 0.64 millimeters. The stem portion 46 of the first compliant pin 16 has a length that is longer than the length of the shaft 20 of the spool 14. A first end 50 of the stem portion 46 connects to the compliant portion 48 of the first compliant pin 16 and a second end 52 of the stem portion 46 terminates in a flat end surface.

The compliant portion 48 of the first compliant pin 16 includes a compliant feature 54 for engaging a hole (not shown) in a printed circuit board (not shown). The compliant feature 54 preferably is formed from two opposed arched portions 56 and 58. An outer surface of each arched portion 56 and 58 acts as a ramp to facilitate insertion of the first compliant pin 16 into the hole in the printed circuit board. Each arched portion 56 and 58 of the compliant feature 54 preferably has a square cross-sectional shape having dimensions equal to the dimension of the stem portion 46 of the first complaint pin 16. An elliptical opening 60 separates the two arched portions 56 and 58. The elliptical opening 60 has a width that, at its widest point, is approximately equal to the width of the stem portion 46 of the first complaint pin 16.

The compliant portion 48 terminates on an end opposite the stem portion 46 with a short extension 62. The extension 62 extends axially outward of the compliant feature 54 on a side opposite the stem portion 46 of the first compliant pin 16. The extension 62 has an axial length that is approximately one-half the axial length of the compliant feature 54 and a cross-section with dimensions equal to the dimension of the stem portion 46 of the first compliant pin 16. The extension 62 simplifies insertion of the first compliant pin 16 in a hole in a printed circuit board.

The second compliant pin 18 (FIG. 1) is identical to the first compliant pin 16. Thus, the same reference numbers are used to identify structures of the second compliant pin 18.

Preferably, the stem portions 46 of both the first and second compliant pins 16 and 18 are molded into the thicker portion 36 of the shaft 20 of the spool 14 during injection molding of the spool 14. Alternatively, passages may be molded into the thicker portion of the shaft 20 of the spool 14 and the stem portions 46 of the compliant pins 16 and 18 may be press fit into the passages. Preferably, the second end 52 of the stem portion 46 of each compliant pin 16 and 18 extends outwardly from the second end 24 of the shaft 20 of the spool 14 and the compliant portion 48 of the each compliant pin 16 and 18 extends outwardly from the first end 22 of the shaft 20 of the spool 14.

The electric coil 12 is formed from a wire 64 having first and second end portions 66 and 68 (FIG. 1), respectively. The first end portion 66 of the wire 64 is terminated on the stem portion 46 of the first compliant pin 16 in a location axially outward of the second end 24 of the shaft 20 of the spool 14. The wire 64 is then wound around the shaft 20 between the first and second ends 22 and 24 of the shaft 20 to form the electric coil 12. The second end portion 68 of the wire 64 is then terminated on the stem portion 46 of the second compliant pin 18 in a location outward of the second end 24 of the shaft 20 of the spool 14. The first and second flanges 38 and 40 help to maintain the electric coil 12 on the shaft 20 in an orderly manner.

After the end portions 66 and 68 of the wire 64 are terminated on the respective stem portions 46 of the first and second compliant pins 16 and 18, the stem portions 46 of the compliant pins 16 and 18 are dip soldered so that the end portions 66 and 68 of the wire 64 become soldered to the respective compliant pins 16 and 18. It is important to note that termination of the end portions 66 and 68 of the wire 64 on a side of the spool 14 opposite the compliant feature 54 aids in the efficient manufacture of the apparatus 10 by allowing the end portions 66 and 68 of the wire 64 to be dip soldered to the compliant pins 16 and 18. If the end portions 66 and 68 of the wire 64 were terminated on the same side of the spool 14 as the compliant portion 48, the dip soldering would likely eliminate the elliptical opening 60 of the compliant feature 54 by filling the opening 60 with solder.

Figure 4:
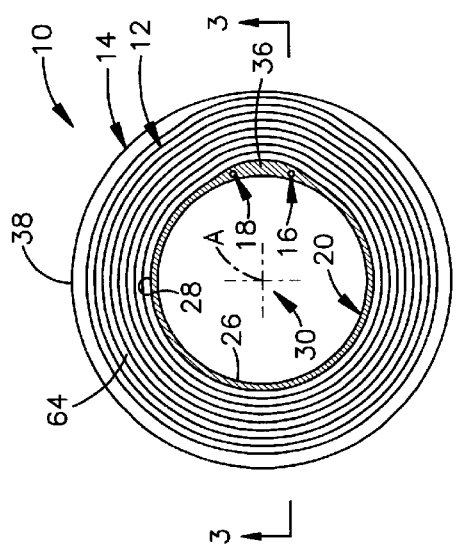
FIG. 4 is a torn-away view similar to the view shown in FIG. 1, but with a modification to the apparatus.

In one modification, the end portions 46 (FIG. 4) could be bent 90° to rest against the flange 40. The bending could occur after solder dipping. The bending may be useful if clearance is required.

To attach the apparatus 10 (FIG. 1) to a printed circuit board, the short extension 62 forming an end of the compliant portion 48 of the first compliant pin 16 is inserted into a first hole on the printed circuit board. The short extension 62 forming an end of the compliant portion 48 of the second compliant pin 18 is inserted into a second hole on the printed circuit board. A force, in the direction of arrow F in FIG. 3, is applied to the second end 52 of the stem portion 46 of each compliant pin 16 and 18. The force causes the compliant feature 54 of each compliant pin 16 and 18 to be pressed into the respective hole of the printed circuit board. When the compliant feature 54 is pressed into the respective hole, the compliant feature 54 deforms and becomes fixed in the respective hole of the printed circuit board. Thus, the compliant feature 54 of the first and second compliant pins 16 and 18 eliminates the need to solder the respective pins to the printed circuit board.

An additional advantage of the apparatus 10 of the present invention is that the force F, used to insert the compliant feature 54 in the printed circuit board, may be applied directly to the compliant pins 16 and 18. A typical force necessary to insert a compliant pin in a hole of a printed circuit board ranges from about twelve to about sixteen pounds. By applying the force directly to the compliant pins 16 and 18, the spool 14 may be manufactured using less material, as the spool 14 will not need to withstand the force necessary to insert the compliant pins 16 and 18 into the printed circuit board.

From the above description of the invention, those skilled in the art will perceive improvements, changes and modifications. Such improvements, changes and modifications within the skill of the art are intended to be covered by the appended claims.

Having described the invention, the following is claimed:

1. An apparatus for attaching an electric coil to a printed circuit board, the apparatus comprising:

a spool having a shaft with axially opposite first and second ends, the electric coil being supported on the shaft between the first and second ends; and at least one compliant pin having a stem portion and a compliant portion, part of the stem portion extending into the first end of the shaft of the spool and at least partially along the shaft of the spool, the compliant portion being located on an end of the compliant pin and extending outwardly from the first end of the shaft of the spool for attaching to the printed circuit board.

2. The apparatus of claim 1 further including:

a first flange extending radially outwardly from the first end of the shaft; and a second flange extending radially outwardly from the second end of the shaft.

3. The apparatus of claim 1 further being defined by:

the shaft of the spool including a portion for receiving the stem of the compliant pin, the portion for receiving the stem of the compliant pin having a thickness that is greater than a thickness of a remainder of the shaft.

4. The apparatus of claim 1 further being defined by:

the stem portion of the compliant pin having a length that is greater than a length of the shaft and extending along the length of the shaft and outwardly from the second end of the shaft.

5. The apparatus of claim 4 further being defined by:

the at least one compliant pin comprising a first compliant pin and a second compliant pin;

the electric coil being formed from a wire having first and second end portions, the first end portion of the wire being terminated on the first compliant pin and the second end portion of the wire being terminated on the second compliant pin.

6. The apparatus of claim 5 further being defined by:

the first end portion of the wire being terminated on a portion of the first compliant pin extending outwardly from the second end of the shaft; and the second end portion of the wire being terminated on a portion of the second compliant pin extending outwardly from the second end of the shaft.

* * * * *